(12) United States Patent
Park et al.

(10) Patent No.: US 10,051,738 B2
(45) Date of Patent: Aug. 14, 2018

(54) FLEXIBLE PRINTED CIRCUIT FILM AND DISPLAY DEVICE USING THE SAME (71) Applicant: LG Display Co., Ltd., Seoul (KR)

(72) Inventors: KeunBum Park, Gyeonggi-do (KR); SungLim Nam, Gyeonggi-do (KR); TaeHyun Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/248,210

(22) Filed: Aug. 26, 2016

(65) Prior Publication Data
US 2017/0064826 A1 Mar. 2, 2017

(30) Foreign Application Priority Data
Aug. 31, 2015 (KR) .................. 10-2015-0123130

(51) Int. Cl.
H05K 1/00 (2006.01)
H05K 1/11 (2006.01)
(Continued)

(52) U.S. Cl.
CPC ......... *H05K 1/118* (2013.01); *G02F 1/13452* (2013.01); *H05K 1/111* (2013.01); *H05K 1/144* (2013.01); *H05K 1/147* (2013.01); *H05K 1/189* (2013.01); *G02F 1/133512* (2013.01); *G02F 1/133514* (2013.01); *G02F 1/133553* (2013.01); *G02F 1/133602* (2013.01); *G02F 1/133608* (2013.01); *G02F 1/134309* (2013.01); *G02F 1/136286* (2013.01); *G02F 2201/123* (2013.01); *G02F 2201/503* (2013.01); *G02F 2202/28* (2013.01); *H05K 2201/058* (2013.01);
(Continued)

(58) Field of Classification Search
CPC ........ H05K 1/118; H05K 1/147; H05K 1/189; H05K 2201/058; H05K 2201/09781; G02F 1/134309
USPC .......................................... 174/254; 361/749
See application file for complete search history.

(56) References Cited

U.S. PATENT DOCUMENTS 4,127,740 A * 11/1978 LaMarche ............ H01H 13/702
174/254
4,735,847 A * 4/1988 Fujiwara .................. H01R 4/04
428/209
(Continued)

FOREIGN PATENT DOCUMENTS

CN 103810940 A 5/2014
CN 104181734 A 12/2014

OTHER PUBLICATIONS

First Notification of Office Action dated Jun. 4, 2018, The State Intellectual Property Office of the People's Republic of China in counterpart Chinese application No. 201610753397.0 Note: US 2005/0230337 cited therein is already of record.

*Primary Examiner* — Sherman Ng
(74) *Attorney, Agent, or Firm* — Morgan, Lewis & Bockius LLP (57) ABSTRACT

A flexible printed circuit film connects a substrate with a printed circuit board. The flexible printed circuit film includes a first area configured to be attached to the substrate; a second area configured to be connected with the printed circuit board; and a third area between the first area and the second area. Each of the first area and the third area has a trapezoid shape with a width that gradually decreases in a direction toward the second area, and the second area has a rectangular shape.

17 Claims, 7 Drawing Sheets

(51) Int. Cl.
  *H05K 1/14*   (2006.01)
  *H05K 1/18*   (2006.01)
  *G02F 1/1345* (2006.01)
  *G02F 1/1343*     (2006.01)
  *G02F 1/1335*     (2006.01)
  *G02F 1/1362*     (2006.01)

(52) U.S. Cl.
  CPC .............. *H05K 2201/09709* (2013.01); *H05K 2201/09781* (2013.01); *H05K 2201/10128* (2013.01); *H05K 2201/10136* (2013.01)

(56) References Cited

U.S. PATENT DOCUMENTS

| | | | |
|---|---|---|---|
| 5,592,365 A * | 1/1997 | Sugimoto | H05K 3/323 |
| | | | 174/254 |
| 7,307,854 B2 * | 12/2007 | Itokawa | H05K 1/147 |
| | | | 174/254 |
| 2009/0244035 A1 * | 10/2009 | Cho | G02F 1/13452 |
| | | | 345/204 |
| 2010/0245299 A1 * | 9/2010 | Han | G02F 1/13452 |
| | | | 345/204 |
| 2014/0151654 A1 | 6/2014 | Ryu et al. | |
| 2014/0339574 A1 * | 11/2014 | Kang | H01L 27/124 |
| | | | 257/88 |
| 2015/0230337 A1 * | 8/2015 | Kim | H05K 1/118 |
| | | | 361/751 |

\* cited by examiner

FIG. 10

FLEXIBLE PRINTED CIRCUIT FILM AND DISPLAY DEVICE USING THE SAME

CROSS REFERENCE TO RELATED APPLICATIONS

This application claims the benefit of the Korean Patent Application No. 10-2015-0123130 filed on Aug. 31, 2015, which is hereby incorporated by reference as if fully set forth herein.

BACKGROUND

Field of the Invention

The present invention relates to a display device, and more particularly, to a panel driver for applying a signal to a display panel.

Discussion of the Related Art

Various display devices have been researched and studied including, for example, liquid crystal display devices, plasma display panels, organic light emitting display devices, etc. A display device may include a display panel for displaying an image, and a panel driver for driving the display panel. Hereinafter, a related art display panel and a related art panel driver will be described with reference to the accompanying drawings.

Figure 1A:
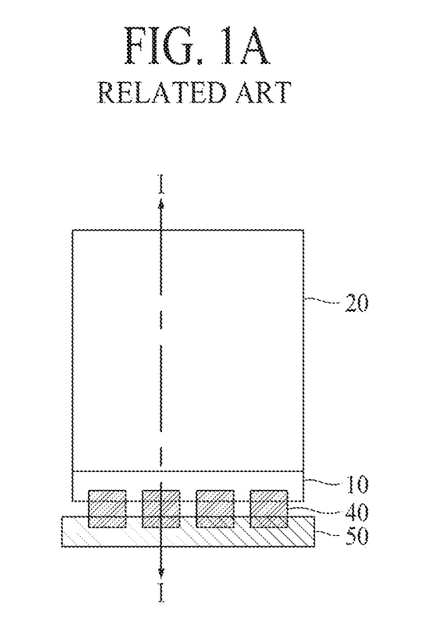
FIG. 1A is a plane view illustrating a related art display device.
Figure 1B:
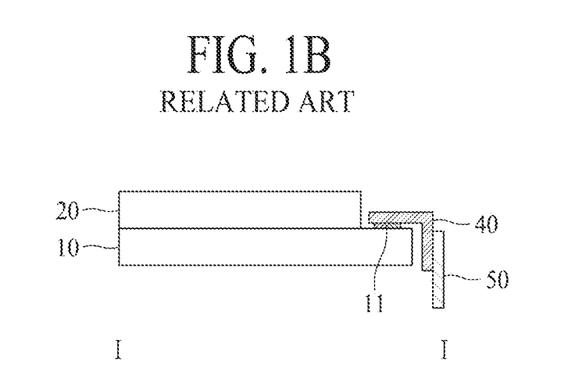
FIG. 1B is a cross sectional view along line I-I of FIG. 1A.

FIG. 1A is a plane view illustrating a related art display device, and FIG. 1B is a cross sectional view along line I-I of FIG. 1A.

As shown in FIGS. 1A and 1B, the related art display device may include a lower substrate 10, an upper substrate 20, a flexible printed circuit film 40, and a printed circuit board 50. The lower substrate 10 and the upper substrate 20 may constitute a display panel, and the flexible printed circuit film 40 and the printed circuit board 50 constitute a panel driver.

Various signal lines (not shown) may be provided on the lower substrate 10. Also, a signal pad 11 may be prepared at an end of the signal line to be connected with the flexible printed circuit film 40. In more detail, the flexible printed circuit film 40 may be attached to an upper surface of the signal pad 11. For this attachment, the upper surface of the signal pad 11 is exposed. That is, the lower substrate 10 may extend beyond the upper substrate 20, and the signal pad 11 may be provided on the upper surface of the extended lower substrate 10. Further, the flexible printed circuit film 40 may be connected with the printed circuit board 50.

However, because the flexible printed circuit film 40 is attached to the upper surface of the signal pad 11 in the related art display device, a bezel area is increased to expose the upper surface of the signal pad 11. In addition, it is difficult to provide various types of the display device having good external appearances due to a height difference in the bezel area.

SUMMARY

Accordingly, the present invention is directed to a display device and a flexible printed circuit film applied to the display device that substantially obviate one or more problems due to limitations and disadvantages of the related art.

An object of the present invention is to provide a display device that is capable of reducing a bezel area, and removing a height difference from the bezel area, and a flexible printed circuit film applied to the display device.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a flexible printed circuit film configured to connect a substrate with a printed circuit board comprises a first area configured to be attached to the substrate; a second area configured to be connected with the printed circuit board; and a third area between the first area and the second area, wherein each of the first area and the third area has a trapezoid shape with a width that gradually decreases in a direction toward the second area, and the second area has a rectangular shape.

In another aspect, a flexible printed circuit film configured to connect a substrate with a printed circuit board comprises a first area configured to be attached to the substrate; a second area configured to be connected with the printed circuit board; a third area between the first area and the second area; a fourth area between the first area and the third area to connect the first area with the third area; and a fifth area between the second area and the third area to connect the second area with the third area, wherein the third area has a trapezoid shape with a width that gradually decreases in a direction toward the second area, and each of the fourth area and the fifth area includes a first side of a curved shape.

In another aspect, a flexible printed circuit film configured to connect a substrate with a printed circuit board comprises a first area configured to be attached to the substrate and having a rectangular shape; a second area configured to be connected with the printed circuit board and having a rectangular shape with an area is smaller than that of the first area; a third area between the first area and the second area and having a trapezoid shape with a width that gradually decreases in a direction toward the second area; and a dummy area connected with one side of each of the first area, the second area, and the third area.

In another aspect, a display device comprises first and second substrates confronting each other; a pad on the first substrate; a connection electrode connected with one side of the pad; and a flexible printed circuit film connected with the connection electrode, wherein the flexible printed circuit film includes: a first area configured to be attached to the substrate; a second area configured to be connected with the printed circuit board; and a third area between the first area and the second area, wherein each of the first area and the third area has a trapezoid shape with a width that gradually decreases in a direction toward the second area, and the second area has a rectangular shape.

In another aspect, a display device comprises first and second substrates confronting each other; a pad on the first substrate; a connection electrode connected with one side of the pad; and a flexible printed circuit film connected with the connection electrode, wherein the flexible printed circuit film includes: a first area configured to be attached to the substrate; a second area configured to be connected with the printed circuit board; a third area between the first area and the second area; a fourth area between the first area and the third area to connect the first area with the third area; and a fifth area between the second area and the third area to connect the second area with the third area, wherein the third area has a trapezoid shape with a width that gradually decreases in a direction toward the second area, and each of the fourth area and the fifth area includes a first side of a curved shape.

In another aspect, a display device comprises first and second substrates confronting each other; a pad on the first substrate; a connection electrode connected with one side of the pad; and a flexible printed circuit film connected with the connection electrode, wherein the flexible printed circuit film includes: a first area configured to be attached to the substrate and having a rectangular shape; a second area configured to be connected with the printed circuit board and having a rectangular shape with an area is smaller than that of the first area; a third area between the first area and the second area and having a trapezoid shape with a width that gradually decreases in a direction toward the second area; and a dummy area connected with one side of each of the first area, the second area, and the third area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In description of embodiments of the present invention, when a structure is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a flexible printed circuit film according to the present invention and a display device using the same will be described with reference to the accompanying drawings.

Figure 2A:
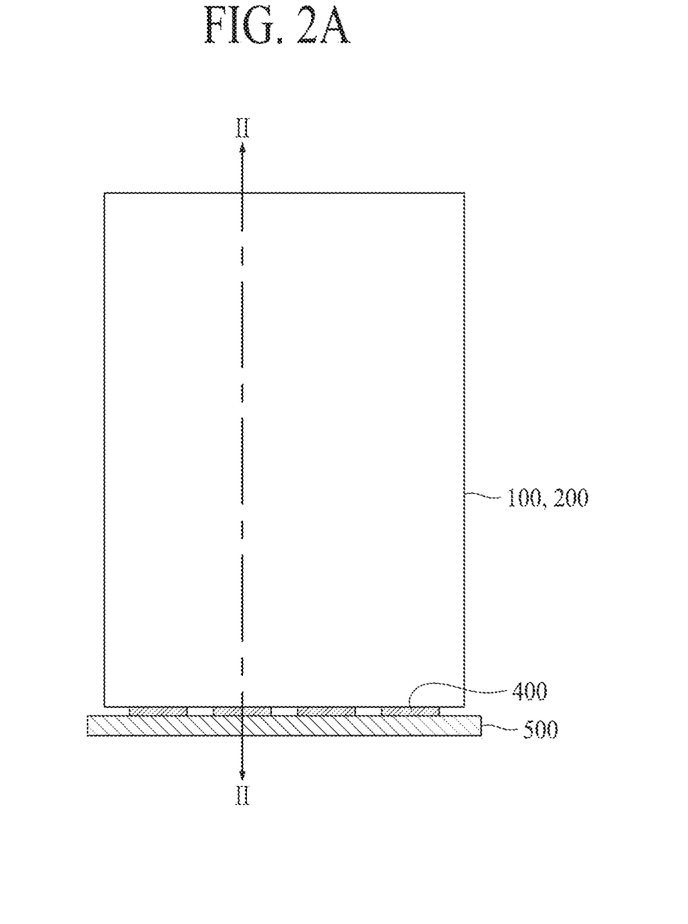
FIG. 2A is a plane view illustrating a display device according to an example embodiment of the present invention.
Figure 2B:
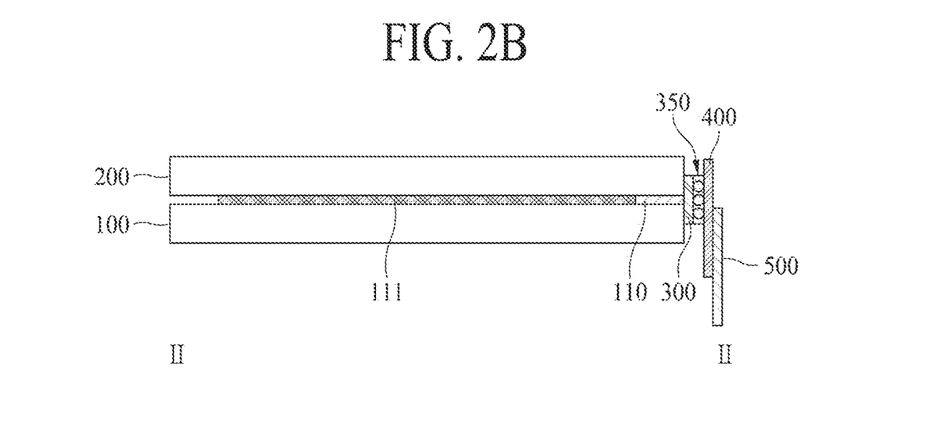
FIG. 2B is a cross sectional view along line II-II of FIG. 2A.

FIG. 2A is a plane view illustrating a display device according to an example embodiment of the present invention, and FIG. 2B is a cross sectional view along line II-II of FIG. 2A.

As shown in FIG. 2A, the display device according to an example embodiment of the present invention may include a first substrate 100, a second substrate 200, a flexible printed circuit film 400, and a printed circuit board 500. The first substrate 100 and the second substrate 200 are bonded to each other, thereby forming a display panel. The flexible printed circuit film 400 and the printed circuit board 500 constitute a panel driver. The flexible printed circuit film 400 is attached to the display panel, and the printed circuit board 500 is connected with the flexible printed circuit film 400.

The first substrate 100 and the second substrate 200 may have the same shape. The first substrate 100 and the second substrate 200 may have the same tetragonal structure with the same shape. That is, according to an example embodiment of the present invention, a predetermined area of the first substrate 100 for an attachment of the flexible printed circuit film 400 is not extended out of the second substrate 200, that is, one side of the first substrate 100 corresponds exactly to one side of the second substrate 200 in the area for an attachment of the flexible printed circuit film 400. The first substrate 100 is not extended beyond the second substrate 200. Thus, the flexible printed circuit film 400 is not attached to an upper surface of the first substrate 100 but, instead, attached to a lateral side of the display panel.

In the drawings, at one side of the display panel, for example, a lower side of the display panel, the flexible printed circuit film 400 and the printed circuit board 500 are connected with each other. Additionally, at another side of the display panel, that is, a left side of the display panel, the flexible printed circuit film 400 and the printed circuit board 500 may be connected with each other.

As shown in FIG. 2B, the first substrate 100 and the second substrate 200 face each other, and a length of the first substrate 100 is the same as a length of the second substrate 200. Also, one end of the first substrate 100 corresponds to one end of the second substrate 200, and the other end of the first substrate 100 corresponds to the other end of the second substrate 200.

A detailed structure of each of the first substrate 100 and the second substrate 200 may be changed in accordance with the type of display device. For example, if the display device is applied to a liquid crystal display device, a thin film transistor and a pixel electrode may be provided on the first substrate 100, a black matrix and a color filter may be provided on the second substrate 200, and a liquid crystal layer may be interposed between the first substrate 100 and the second substrate 200. But, the present invention is not limited to this structure. That is, the structure is changeable to various structures generally known to those in the art. Also, the display device may be applied to various modes generally known to those in the art, for example, a Twisted Nematic (TN) mode, an In-Plane Switching (IPS) mode, a Vertical Alignment (VA) mode, or a Fringe Field Switching (FFS) mode. Based on the mode of the display device, a structure of each of the first substrate 100 and the second substrate 200 may be changed. Also, if the display device is applied to an organic light emitting display device, a thin film transistor and an organic light emitting device including an anode, an emission layer, and a cathode may be provided on the first substrate 100, and the second substrate 200 may be formed of an encapsulation substrate. But, the display device is not limited to this structure. That is, the display device can be configured to various structures generally known to those in the art.

A line 111 is provided on the first substrate 100, and a pad 110 is connected with an end of the line 111. The line 111 may be a signal line, for example, a gate line, a data line, or a common voltage line, or may be a non-signal line, such as an antistatic line. In the drawings, the pad 110 is provided at the same layer as that of the line 111, and is formed as one body with the line 111, but is not limited to this structure. For example, the line 111 may be a data line provided on a gate insulating film, and the pad 110 may be a data pad provided under the gate insulating film. In this case, the data pad and the data line are connected with each other via a contact hole provided in the gate insulating film.

In an area provided with the pad 110, one end of the first substrate 100 corresponds to one end of the second substrate 200. Thus, the flexible printed circuit film 400 is not connected with an upper surface of the pad 110, but connected with one side of the pad 110. Herein, one side of the pad 110, to which the flexible printed circuit film 400 is connected, has a small area, thereby resulting in a potentially bad connection between the pad 110 and the flexible printed circuit film 400. To realize a good connection between the pad 110 and the flexible printed circuit film 400, a connection electrode 300 may be provided at one side of the pad 110.

The connection electrode 300 may be in contact with each side of the first substrate 100 and the second substrate 200 provided with the pad 110, whereby the connection electrode 300 is directly connected with one side of the pad 110. The connection electrode 300 may be formed of a material with good conductivity, for example, silver (Ag), but not limited to this material.

To attach the flexible printed circuit film 400 to the connection electrode 300, an adhesive layer 350 is provided between the connection electrode 300 and the flexible printed circuit film 400. A conductive ball is provided inside the adhesive layer 350, whereby the connection electrode 300 and the flexible printed circuit film 400 may be electrically connected with each other through the conductive ball. The flexible printed circuit film 400 is not formed on the upper surface of the first substrate 100, and the flexible printed circuit film 400 is disposed in a vertical direction at each side of the first substrate 100 and the second substrate 200. Also, the printed circuit board 500 is connected with the flexible printed circuit film 400.

Although not shown, a chip, such as a driving integrated circuit, may be provided on the flexible printed circuit film 400 to form a chip on film (COF) structure, but not limited to this structure. Also, a lead line is provided on the flexible printed circuit film 400, and the lead line is connected with the connection electrode 300 through the conductive ball of the adhesive layer 350.

The printed circuit board 500 provides various signals to the display panel through the flexible printed circuit film 400. Although not shown, a timing controller, various power circuits, or a memory device may be provided on the printed circuit board 500.

According to an example embodiment of the present invention, the flexible printed circuit film 400 is attached to each side of the first substrate 100 and the second substrate 200. Thus, there is no need to extend the first substrate 100 out of the second substrate 200 to expose the upper surface of the pad 110 to the outside. Accordingly, a bezel area of the display device may be decreased as compared to that of the display device according to the related art. Also, one end of the first substrate 100 corresponds to one end of the second substrate 200, and the other end of the first substrate 100 corresponds to the other end of the second substrate 200 so that it is possible to prevent a height difference in the bezel area.

Figure 3:
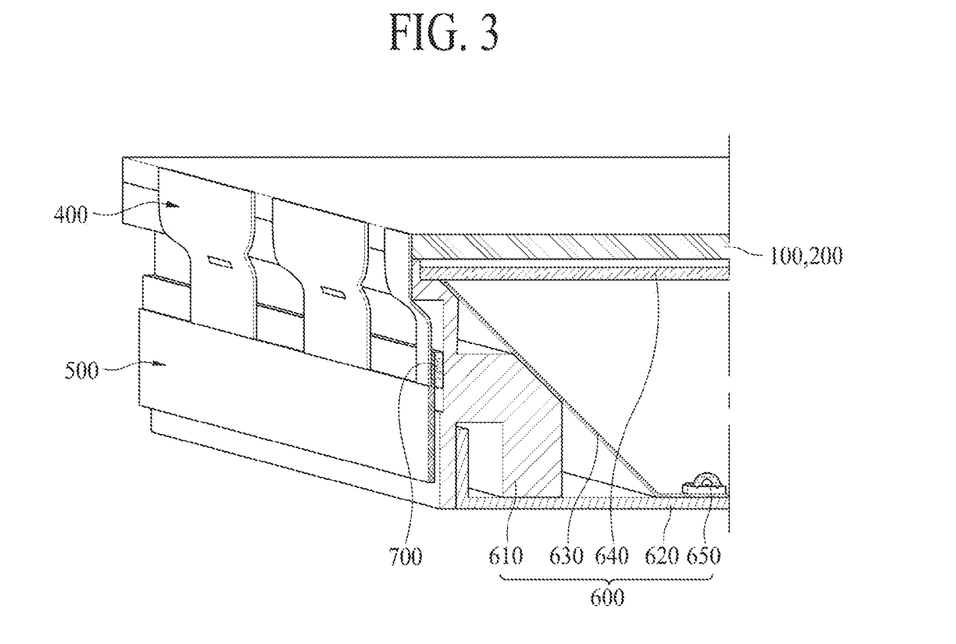
FIG. 3 is a perspective view illustrating the display device according to an example embodiment of the present invention.

FIG. 3 is a perspective view illustrating the display device according to an example embodiment of the present invention.

As shown in FIG. 3, the display device according to an example embodiment of the present invention may include the display panel having the first substrate 100 and the second substrate 200, the flexible printed circuit film 400, the printed circuit board 500, a backlight unit 600, and a shock-absorbing member 700. The display panel having the first substrate 100 and the second substrate 200, the flexible printed circuit film 400, and the printed circuit board 200 are the same as those described above.

The backlight unit 600 is disposed below the display panel, and the backlight unit 600 supplies light to the display panel. The backlight unit 600 may include a guide panel 610, a lower case 620, a reflective plate 630, an optical sheet 640, and a light source 650.

The guide panel 610 supports the display panel. The lower case 620, which is assembled with the guide panel 610, forms a lower structure of the display device. The reflective plate 630 is disposed on the lower case 620, wherein the reflective plate 630 reflects light emitted from the light source 650 toward the display panel. The optical sheet 640 is supported by the guide panel 610, whereby the light emitted from the light source 650 is uniformly incident on the display panel by the optical sheet 640. The light source 650 is provided on the reflective plate 630. The light source 650 may have various types generally known to those in the art. For example, a direct-type method is shown in the drawings, that is, the plurality of light source 650 are disposed under the display panel, whereby the light emitted from the light source 650 advances to an upper direction. A light-guiding plate method may be applied, wherein the light emitted from the light source 650 is changed in its advancing direction via a light-guiding plate, and then the light advances to an upper direction.

The shock-absorbing member 700 is provided between the flexible printed circuit film 400 and the guide panel 610 to stably position the flexible printed circuit film 400. The flexible printed circuit film 400 attached to each side of the first substrate 100 and the second substrate 200 extends to a lower direction along the guide panel 620, and the printed circuit board 500 connected with the flexible printed circuit film 400 extends to a lower direction. In this case, the shock-absorbing member 700 is provided between the guide panel 610 and the flexible printed circuit film 400 to prevent the flexible printed circuit film 400 from being moved freely.

Meanwhile, one end of the flexible printed circuit film 400 is attached to each side of the first substrate 100 and the second substrate 200, and the other end of the flexible printed circuit film 400 is connected with the printed circuit board 500. Herein, a position of one end and the other end of the flexible printed circuit film 400 may be not corresponding in a vertical direction, whereby the flexible printed circuit film 400 may be assembled in a curved state. In this case, for a process of combining the flexible printed circuit film 400, there may be an interference between the flexible printed circuit film 400 and the structure such as the guide panel 610. Hereinafter, the flexible printed circuit film 400 according to various embodiments of the present invention to reduce the interference will be described in detail as follows. In the following drawings, line I-I, line II-II, line III-III, and line IV-IV are imaginary lines for dividing each area.

Figure 4:
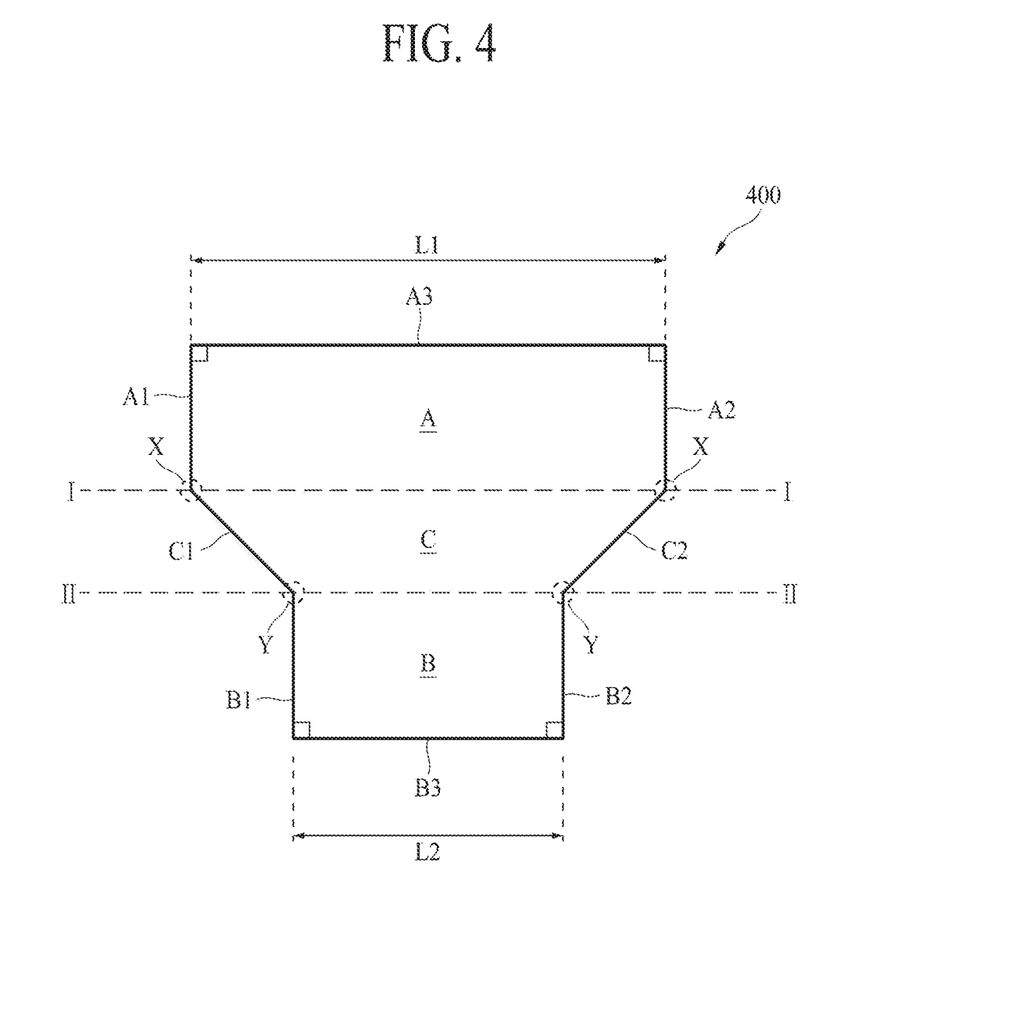
FIG. 4 is a view illustrating a flexible printed circuit film according to an example embodiment of the present invention.

FIG. 4 is a view illustrating the flexible printed circuit film according to an example embodiment of the present invention.

As shown in FIG. 4, the flexible printed circuit film 400 according to an example embodiment of the present invention may include a first area (A), a second area (B), and a third area (C). The first area (A) is the area attached to each side of the first substrate 100 and the second substrate 200, the second area (B) is the area connected with the printed circuit board 500, and the third area (C) is the area provided between the first area (A) and the second area (B). The third area (C) is the middle area for connecting the first area (A) and the second area (B) with each other.

The first area (A) may include first and second sides (A1, A2) facing each other, and a third side (A3) for connecting the first and second sides (A1, A2) with each other. Each of the first side (A1), the second side (A2), and the third side (A3) included in the first area (A) is formed of a straight line. In this case, the first side (A1) is perpendicular to the third side (A3), the second side (A2) is perpendicular to the third side (A3), and the first side (A2) is parallel to the second side (A2), to thereby form a rectangular structure in the first area (A).

The second area (B) may include first and second sides (B1, B2) facing each other, and a third side (B3) for connecting the first and second sides (B1, B2) with each other. Each of the first side (B1), the second side (B2), and the third side (B3) included in the second area (B) is formed in a straight line. In this case, the first side (B1) is perpendicular to the third side (B3), the second side (B2) is perpendicular to the third side (B3), and the first side (B1) is parallel to the second side (B2), to thereby form a rectangular structure in the second area (B).

The first side (A1) and the second side (A2) of the first area (A) are parallel to the first side (B1) and the second side (B2) of the second area (B). Also, the third side (A3) of the first area (A) is parallel to the third side (B3) of the second area (B). A length (L1) of the third side (A3) of the first area (A) is larger than a length (L2) of the third side (B3) of the second area (B). That is, an area of the second area (B) is smaller than an area of the first area (A). According as the length (L1) of the third side (A3) of the first area (A) is relatively large, it facilitates a process of attaching the flexible printed circuit film 400 to each side of the first substrate 100 and the second substrate 200. Also, because the length (L2) of the third side (B3) of the second area (B) is relatively small, it is possible to decrease a size of the printed circuit board 500.

The third area (C) may include first and second sides (C1, C2) facing each other. Each of the first side (C1) and the second side (C2) of the third area (C) is formed of a straight line. The first side (C1) of the third area (C) is connected with the first side (A1) of the first area (A) and the first side (B1) of the second area (B). The second side (C2) of the third area (C) is connected with the second side (A2) of the first area (A) and the second side (B2) of the second area (B). In this case, the length (L1) of the third side (A3) of the first area (A) is larger than the length (L2) of the third side (B3) of the second area (B), whereby the first side (C1) of the third area (C) is not parallel to the second side (C2) of the third area (C), thereby forming a trapezoid structure in the third area (C).

In the case of the flexible printed circuit film 400 shown in FIG. 4, there may be the interference between the aforementioned structure and the flexible printed circuit film 400 at each point (X) where the first side (C1) of the third area (C) meets with the first side (A1) of the first area (A) and the second side (C2) of the third area (C) meets with the second side (A2) of the first area (A), and each point (Y) where the first side (C1) of the third area (C) meets with the first side (B1) of the second area (B) and the second side (C2) of the third area (C) meets with the second side (B2) of the second area (B). If the interference is generated between the structure and the flexible printed circuit film 400, a crack may occur in the flexible printed circuit film 400, and furthermore, the flexible printed circuit film 400 may be separated from the sides of the first and second substrates 100 and 200.

Hereinafter, the flexible printed circuit film 400 according to various embodiments of the present invention to reduce the aforementioned interference for the assembling process will be described in detail as follows.

Figure 5:
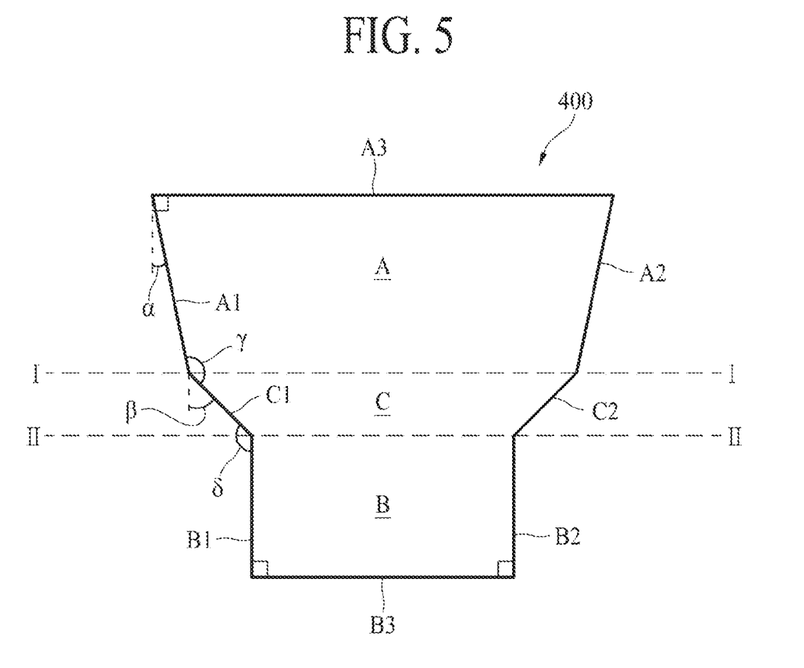
FIG. 5 is a view illustrating a flexible printed circuit film according to another example embodiment of the present invention.

FIG. 5 is a view illustrating a flexible printed circuit film according to another example embodiment of the present invention. As shown in FIG. 5, the flexible printed circuit film according to another example embodiment of the present invention may include a first area (A), a second area (B), and a third area (C).

The first area (A) is the area attached to each side of the first substrate 100 and the second substrate 200, the second area (B) is the area connected with the printed circuit board 500, and the third area (C) is the area provided between the first area (A) and the second area (B). Especially, the third area (C) is the middle area for connecting the first area (A) and the second area (B) with each other.

The first area (A) may include first and second sides (A1, A2) facing each other, and a third side (A3) for connecting the first and second sides (A1, A2) with each other. Each of the first side (A1), the second side (A2), and the third side (A3) included in the first area (A) is formed of a straight line.

In this case, the first side (A1) is not perpendicular to the third side (A3), the second side (A2) is not perpendicular to the third side (A3), and the first side (A1) is not parallel to the second side (A2), whereby the first area (A) is formed in a trapezoid structure whose width is gradually decreased in a direction toward the second area (B). Especially, a first angle (α) between a line (dotted line) being perpendicular to the third side (A3) and the first side (A1) may satisfy a range of 5°≤α<45°, for example. If the first area (A) is formed in the trapezoid structure, and the first angle (α) satisfies the range of 5°≤α<45°, it is possible to easily control a third angle (γ) and a fourth angle (δ), thereby preventing the aforementioned interference.

Because the first area (A) is formed in bilateral symmetry, although not shown, an angle between a line perpendicular to the third side (A3) and the second side (A2) corresponds to the first angle (α) satisfying a range of 5°≤α<45°. The second area (B) may include first and second sides (B1, B2) facing each other, and a third side (B3) for connecting the first and second sides (B1, B2) with each other. Each of the first side (B1), the second side (B2), and the third side (B3) included in the second area (B) is formed in a straight line.

In this case, the first side (B1) is perpendicular to the third side (B3), the second side (B2) is perpendicular to the third side (B3), and the first side (B1) is parallel to the second side (B2), thereby forming a rectangular structure in the second area (B).

The third side (A3) of the first area (A) is parallel to the third side (B3) of the second area (B). However, a length (L1) in the third side (A3) of the first area (A) is larger than a length (L2) in the third side (B3) of the second area (B). Accordingly, an area of the second area (B) is smaller than an area of the first area (A). Because as the length (L1) of the third side (A3) of the first area (A) is relatively large, it facilitates a process of attaching the flexible printed circuit film 400 to each side of the first substrate 100 and the second substrate 200, in the same way as the aforementioned embodiment. Also, because the length (L2) of the third side (B3) of the second area (B) is relatively small, it is possible to decrease a size of the printed circuit board 500, in the same way as the aforementioned embodiment, which is applied to the following embodiments.

The third area (C) may include first and second sides (C1, C2) facing each other. Each of the first side (C1) and the second side (C2) of the third area (C) is formed of a straight line. The first side (C1) of the third area (C) is not parallel to the second side (C2) of the third area (C).

The first side (C1) of the third area (C) is connected with the first side (A1) of the first area (A) and the first side (B1) of the second area (B). The second side (C2) of the third area (C) is connected with the second side (A2) of the first area (A) and the second side (B2) of the second area (B). In this case, the third area (C) is formed in a trapezoid structure whose width is gradually decreased in a direction toward the second area (B). According to example embodiments of the present invention, both the first area (A) and the third area (C) are formed in a trapezoid shape so that interference can be prevented between the flexible printed circuit film and structures for the bonding process of bonding the flexible printed circuit film to the structure.

A second angle (β) between a line (dotted line) being perpendicular to the third side (A3) of the first area (A) and the first side (C1) of the third area (C) may satisfy a range of 5°<α≤45°, for example. Although not shown, since the third area (C) is formed in bilateral symmetry, an angle between a line being in perpendicular to the third side (A3) of the first area (A) and the second side (C2) of the third area (C) corresponds to the second angle (β) satisfying a range of 5°<β≤45°.

Here, the second angle (β) may be larger than the first angle (α). A third angle (γ) between the first side (A1) of the first area (A) and the first side (C1) of the third area (C) is defined by [180°+the first angle (α)−the second angle (β)]. If the second angle (β) is the same as or smaller than the first angle (α), the third angle (γ) is 180° or more than 180°, to thereby reduce an effect of preventing the interference at the point where the first side (A1) of the first area (A) meets with the first side (C1) of the third area (C). If the second angle (β) is larger than the first angle (α), the third angle (γ) is less than 180°, thereby improving an effect of preventing the interference at the point where the first side (A1) of the first area (A) meets with the first side (C1) of the third area (C).

Also, a fourth angle (δ) between the first side (B1) of the second area (B) and the first side (C1) of the third area (C) is defined by [180°−the second angle (β)]. If the second angle (β) is within a range of 5°<β≤45°, it is possible to improve an effect of preventing the interference at the point where the first side (B1) of the second area (B) meets with the first side (C1) of the third area (C).

Figure 6:
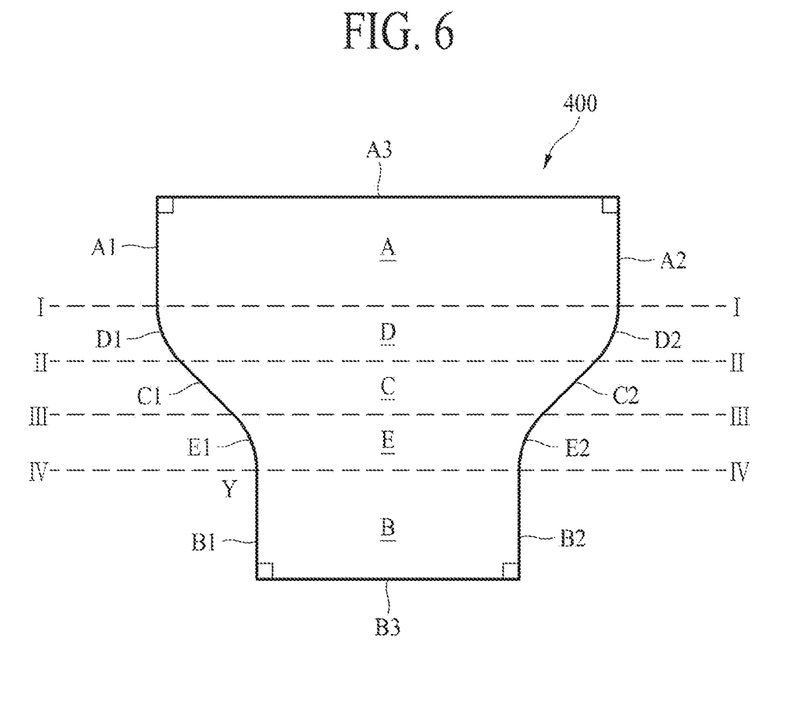
FIG. 6 is a view illustrating a flexible printed circuit film according to another example embodiment of the present invention.

FIG. 6 is a view illustrating a flexible printed circuit film according to another example embodiment of the present invention.

As shown in FIG. 6, the flexible printed circuit film according to another example embodiment of the present invention may include a first area (A), a second area (B), a third area (C), a fourth area (D), and a fifth area (E). The first area (A) is the area attached to each side of the first substrate 100 and the second substrate 200, the second area (B) is the area connected with the printed circuit board 500, the third area (C) is the middle area between the first area (A) and the second area (B), the fourth area (D) is the area for connecting the first area (A) and the third area (C) with each other, and the fifth area (E) is the area for connecting the second area (B) and the third area (C) with each other. The first area (A), the second area (B), and the third area (C) are similar to those of FIG. 4, which will be described in detail as follows.

The first area (A) may include first and second sides (A1, A2) facing each other, and a third side (A3) for connecting the first and second sides (A1, A2) with each other. Each of the first side (A1), the second side (A2), and the third side (A3) included in the first area (A) is formed of a straight line.

In this case, the first side (A1) is perpendicular to the third side (A3), the second side (A2) is perpendicular to the third side (A3), and the first side (A2) is parallel to the second side (A2), thereby forming a rectangular structure in the first area (A).

The second area (B) may include first and second sides (B1, B2) facing each other, and a third side (B3) for connecting the first and second sides (B1, B2) with each other. Each of the first side (B1), the second side (B2), and the third side (B3) included in the second area (B) is formed in a straight line. In this case, the first side (B1) is perpendicular to the third side (B3), the second side (B2) is perpendicular to the third side (B3), and the first side (B1) is parallel to the second side (B2), thereby forming a rectangular structure in the second area (B).

The first side (A1) and the second side (A2) of the first area (A) are parallel to the first side (B1) and the second side (B2) of the second area (B). Also, the third side (A3) of the first area (A) is parallel to the third side (B3) of the second area (B). A length (L1) of the third side (A3) of the first area (A) is larger than a length (L2) of the third side (B3) of the second area (B). That is, an area of the second area (B) is smaller than an area of the first area (A).

The third area (C) may include first and second sides (C1, C2) facing each other. Each of the first side (C1) and the second side (C2) of the third area (C) is formed of a straight line. In this case, the first side (C1) of the third area (C) is not parallel to the second side (C2) of the third area (C). Thus, the third area (C) is formed in a trapezoid shape whose width gradually decreases in a direction toward the second area (B).

The fourth area (D) includes first side (D1) and second side (D2) facing each other. The first side (D1) of the fourth area (D) is connected with the first side (A1) of the first area (A) and the first side (C1) of the third area (C). The second side (D2) of the fourth area (D) is connected with the second side (A2) of the first area (A) and the second side (C2) of the third area (C).

In this case, each of the first side (D1) and the second side (D2) of the fourth area (D) is formed of a curved line, thereby preventing the interference. For example, the radius of curvature in each of the first side (D1) and the second side (D2) of the fourth area (D) is within a range from 5.0 mm to 20 mm, thereby preventing interference.

The fifth area (E) may include first and second sides (E1, E2) facing each other. The first side (E1) of the fifth area (E) is connected with the first side (B1) of the second area (B) and the first side (C1) of the third area (C). The second side (E2) of the fifth area (E) is connected with the second side (B2) of the second area (B) and the second side (C2) of the third area (C).

In this case, each of the first side (E1) and the second side (E2) of the fifth area (E) is formed of a curved line, to thereby obtain the aforementioned effect of preventing the interference. For example, the radius of curvature in each of the first side (E1) and the second side (E2) of the fifth area (E) may be within a range from 5.0 mm to 20 mm, thereby preventing interference.

Figure 7:
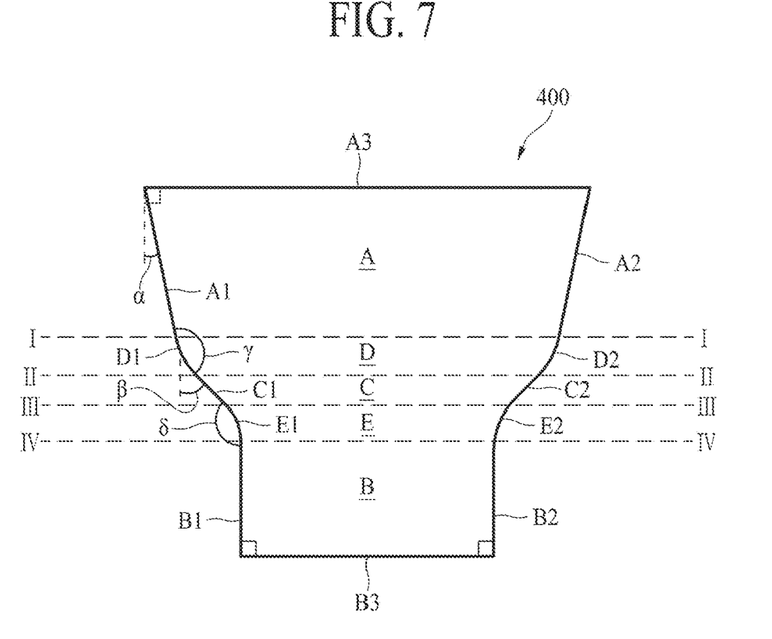
FIG. 7 is a view illustrating a flexible printed circuit film according to another example embodiment of the present invention.

FIG. 7 is a view illustrating a flexible printed circuit film according to another example embodiment of the present invention.

As shown in FIG. 7, the flexible printed circuit film according to another example embodiment of the present invention may include a first area (A), a second area (B), a third area (C), a fourth area (D), and a fifth area (E). The first area (A) is the area attached to each side of the first substrate 100 and the second substrate 200, the second area (B) is the area connected with the printed circuit board 500, the third area (C) is the middle area between the first area (A) and the second area (B), the fourth area (D) is the area for connecting the first area (A) and the third area (C) with each other, and the fifth area (E) is the area for connecting the second area (B) and the third area (C) with each other. The first area (A), the second area (B), and the third area (C) are similar to those of FIG. 5, and the fourth area (D) and the fifth area (E) are similar to those of FIG. 6. This will be described in detail as follows.

The first area (A) may include first and second sides (A1, A2) facing each other, and a third side (A3) for connecting the first and second sides (A1, A2) with each other. Each of the first side (A1), the second side (A2), and the third side (A3) included in the first area (A) is formed of a straight line. In this case, the first side (A1) is not perpendicular to the third side (A3), the second side (A2) is not perpendicular to the third side (A3), and the first side (A1) is not parallel to the second side (A2), whereby the first area (A) is formed in a trapezoid shape whose width is gradually decreased in a direction toward the second area (B). Especially, a first angle ($\alpha$) between a line (dotted line) being perpendicular to the third side (A3) and the first side (A1) may satisfy a range of $5°\leq\alpha<45°$, for example.

The second area (B) may include first and second sides (B1, B2) facing each other, and a third side (B3) for connecting the first and second sides (B1, B2) with each other. Each of the first side (B1), the second side (B2), and the third side (B3) included in the second area (B) is formed in a straight line. In this case, the first side (B1) is perpendicular to the third side (B3), the second side (B2) is perpendicular to the third side (B3), and the first side (B1) is parallel to the second side (B2), thereby forming a rectangular shape in the second area (B).

The third side (A3) of the first area (A) is parallel to the third side (B3) of the second area (B). However, a length (L1) in the third side (A3) of the first area (A) is larger than a length (L2) in the third side (B3) of the second area (B). That is, an area of the second area (B) is smaller than an area of the first area (A).

The third area (C) may include first and second sides (C1, C2) facing each other. Each of the first side (C1) and the second side (C2) of the third area (C) is formed of a straight line. The first side (C1) of the third area (C) is not parallel to the second side (C2) of the third area (C). The third area (C) is formed in a trapezoid shape whose width gradually decreases in a direction toward the second area (B).

A second angle ($\beta$) between a line (dotted line) being perpendicular to the third side (A3) of the first area (A) and the first side (C1) of the third area (C) may satisfy a range of $5°<\alpha\leq45°$, thereby preventing interference by controlling the fourth angle ($\delta$). For example, the second angle ($\beta$) may be larger than the first angle ($\alpha$). In this case, a third angle ($\gamma$) between the first side (A1) of the first area (A) and the first side (C1) of the third area (C) may be less than 180°.

The fourth area (D) includes first side (D1) and second side (D2) facing each other. The first side (D1) of the fourth area (D) is connected with the first side (A1) of the first area (A) and the first side (C1) of the third area (C). The second side (D2) of the fourth area (D) is connected with the second side (A2) of the first area (A) and the second side (C2) of the third area (C).

In this case, each of the first side (D1) and the second side (D2) of the fourth area (D) is formed of a curved line. For example, the radius of curvature in each of the first side (D1)

and the second side (D2) of the fourth area (D) is within a range from 5.0 mm to 20 mm, thereby preventing interference.

The fifth area (E) may include first and second sides (E1, E2) facing each other. The first side (E1) of the fifth area (E) is connected with the first side (B1) of the second area (B) and the first side (C1) of the third area (C). The second side (E2) of the fifth area (E) is connected with the second side (B2) of the second area (B) and the second side (C2) of the third area (C).

In this case, each of the first side (E1) and the second side (E2) of the fifth area (E) is formed of a curved line. For example, the radius of curvature in each of the first side (E1) and the second side (E2) of the fifth area (E) may be within a range from 5.0 mm to 20 mm, thereby preventing interference.

Figure 8:
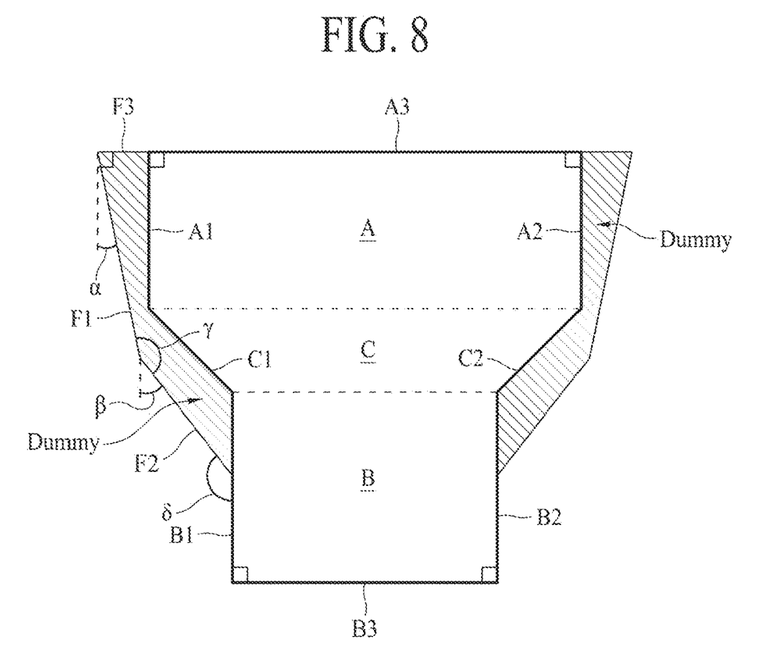
FIG. 8 is a view illustrating a flexible printed circuit film according to another example embodiment of the present invention.

FIG. 8 is a view illustrating a flexible printed circuit film according to another example embodiment of the present invention.

In accordance with FIG. 8, the flexible printed circuit film may be obtained by additionally providing a dummy area in the structure of the flexible printed circuit film of FIG. 4.

The dummy area indicates the area in which a lead line for a signal transmission is not formed. Thus, the flexible printed circuit film of FIGS. 4 to 7 includes the lead line for a signal transmission, wherein the lead line is arranged in the entire area of the flexible printed circuit film.

The dummy area is formed in bilaterally symmetry of the aforementioned flexible printed circuit film shown in FIG. 4, that is, there are the left-sided dummy area and the right-sided dummy area. The left-sided dummy area may include a first side (F1), a second side (F2), and a third side (F3).

The first side (F1) of the dummy area (Dummy) faces a first side (A1) of a first area (A), the second side (F2) of the dummy area (Dummy) faces a first side (C1) of a third area (C), and the third side (F3) of the dummy area (Dummy) extends from a third side (A3) of the first area (A). Each of the first side (F1), the second side (F2), and the third side (F3) of the dummy area (Dummy) is formed in a straight line.

In this case, a first angle ($\alpha$) between a line (dotted line) being perpendicular to the third side (F3) and the first side (F1) may satisfy a range of $5°\leq\alpha<45°$, for example. That is, the angle between the first side (F1) and the third side (F3) of the dummy area (Dummy) may be identical to the angle between the first side (A1) and the third side (A3) of the first area (A) shown in FIG. 5.

Also, a second angle ($\beta$) between a line (dotted line) being perpendicular to the third side (F3) and the second side (F2) may satisfy a range of $5°<\alpha\leq45°$, for example. That is, the angle between the first side (F1) and the second side (F2) of the dummy area (Dummy) may be identical to the angle between the first side (A1) of the first area (A) and the first side (C1) of the third area (C) shown in FIG. 5.

A structure of the dummy area (Dummy) may be the same as the left-side structure and right-side structure of the flexible printed circuit film shown in FIG. 5, thereby preventing interference between the flexible printed circuit film 400 and the structure.

According to an example embodiment of the present invention provided with the dummy area (Dummy), the lead line is not provided in the dummy area (Dummy), but is provided only in the first area (A), the second area (B), and the third area (C) so that it is possible to prevent interference, and to facilitate the formation of the lead line.

FIG. 8 shows the dummy area (Dummy) whose structure is the same as that of the left-side structure and the right-side structure of the flexible printed circuit film 400 shown in FIG. 5. However, the structure of dummy area (Dummy) may be the same as that of the left-side structure and the right-side structure of the flexible printed circuit film 400 shown in FIG. 6 or 7.

Figure 9:
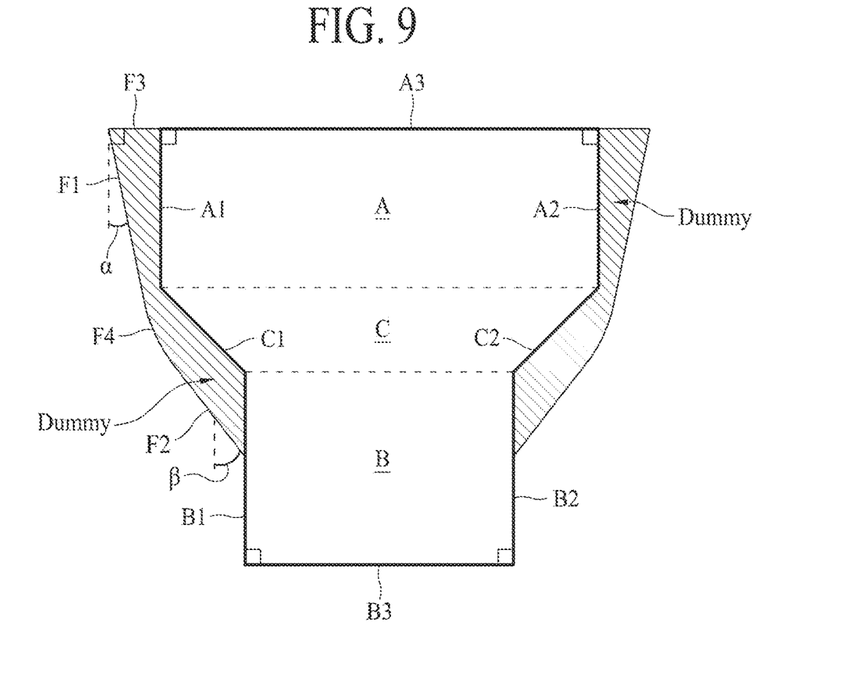
FIG. 9 is a view illustrating a flexible printed circuit film according to another example embodiment of the present invention.

FIG. 9 is a view illustrating a flexible printed circuit film according to another example embodiment of the present invention, wherein a structure of a dummy area (Dummy) is the same as that of the left-side structure and the right-side structure of the flexible printed circuit film 400 shown in FIG. 7.

As shown in FIG. 9, the dummy area (Dummy) may include a first side (F1), a second side (F2), a third side (F3), and a fourth side (F4). The first side (F1) of the dummy area (Dummy) faces a first side (A1) of a first area (A), the second side (F2) of the dummy area (Dummy) faces a first side (C1) of a third area (C), the third side (F3) of the dummy area (Dummy) extends from a third side (A3) of the first area (A), and the fourth side (F4) of the dummy area (Dummy) is provided between the first side (F1) and the second side (F2) of the dummy area (Dummy) to connect the first side (F1) and the second side (F2) of the dummy area (Dummy) with each other.

Each of the first side (F1), the second side (F2), and the third side (F3) of the dummy area (Dummy) is formed in a straight line, and the fourth side (F4) of the dummy area (Dummy) is formed of a curved line.

In this case, a first angle ($\alpha$) between a line (dotted line) being perpendicular to the third side (F3) and the first side (F1) may satisfy a range of $5°\leq\alpha<45°$, for example. Also, a second angle ($\beta$) between a line (dotted line) being perpendicular to the third side (F3) and the second side (F2) may satisfy a range of $5°<\beta\leq45°$, for example. Also, the radius of curvature in the fourth side (F4) is within a range from 5.0 mm to 20 mm, for example.

A structure of the dummy area (Dummy) is the same as the left-side structure and right-side structure of the flexible printed circuit film shown in FIG. 7, thereby preventing interference between the flexible printed circuit film 400 and the structure.

Figure 10:
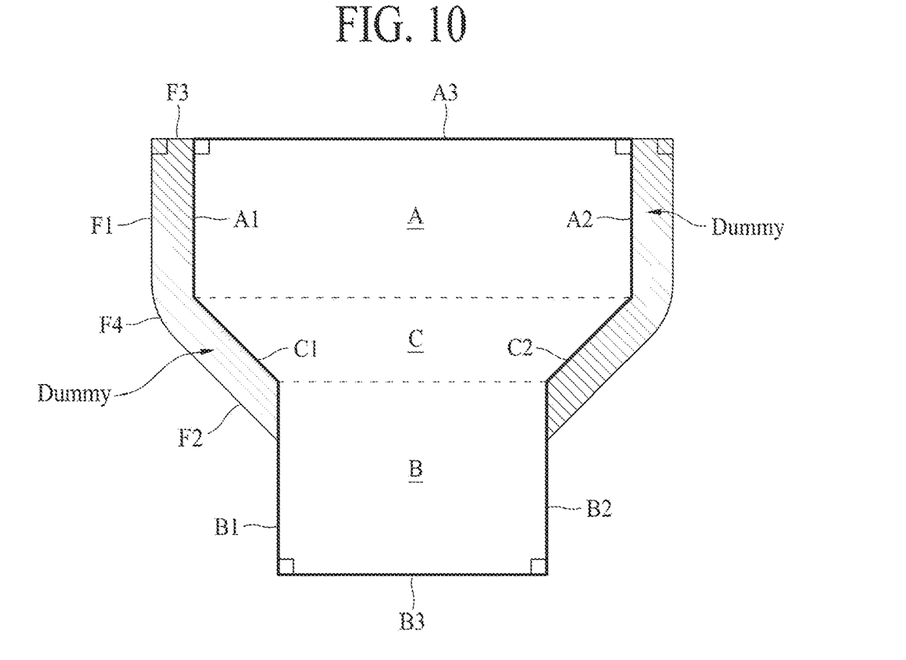
FIG. 10 is a view illustrating a flexible printed circuit film according to another example embodiment of the present invention.

FIG. 10 is a view illustrating a flexible printed circuit film according to another example embodiment of the present invention, wherein a structure of a dummy area (Dummy) is the same as that of the left-side structure and the right-side structure of the flexible printed circuit film 400 shown in FIG. 6.

As shown in FIG. 10, the dummy area (Dummy) may include a first side (F1), a second side (F2), a third side (F3), and a fourth side (F4). The first side (F1) of the dummy area (Dummy) faces a first side (A1) of a first area (A), the second side (F2) of the dummy area (Dummy) faces a first side (C1) of a third area (C), the third side (F3) of the dummy area (Dummy) extends from a third side (A3) of the first area (A), and the fourth side (F4) of the dummy area (Dummy) is provided between the first side (F1) and the second side (F2) of the dummy area (Dummy) to connect the first side (F1) and the second side (F2) of the dummy area (Dummy) with each other.

Each of the first side (F1), the second side (F2), and the third side (F3) of the dummy area (Dummy) is formed in a straight line, and the fourth side (F4) of the dummy area (Dummy) is formed of a curved line. In this case, the radius of curvature in the fourth side (F4) is within a range from 5.0 mm to 20 mm, for example. A structure of the dummy area (Dummy) is the same as the left-side structure and right-side structure of the flexible printed circuit film shown in FIG. 6, thereby preventing interference between the flexible printed circuit film 400 and the structure.

According to an example embodiment of the present invention, the connection electrode is connected with one side of the pad at each side of the first substrate 100 and the second substrate 200. Thus, there is no need to extend the first substrate 100 out of the second substrate 200 to expose the upper surface of the pad 110 to the outside. Accordingly, the bezel area of the display device according to the present invention is decreased in comparison to that of the display device according to the related art. Also, one end of the first substrate 100 corresponds to one end of the second substrate 200, and the other end of the first substrate 100 corresponds to the other end of the second substrate 200 so that it is possible to prevent the height difference in the bezel area.

According to an example embodiment of the present invention, interference between the flexible printed circuit film 400 and the structure for the assembling process of the flexible printed circuit film 400 can be prevented by changing the shape of each side of the flexible printed circuit film and by adjusting the angle between each side of the flexible printed circuit film, thereby preventing cracks in the flexible printed circuit film 400 and preventing the flexible printed circuit film 400 from being separated from the sides of the first and second substrates.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A flexible printed circuit film configured to connect a substrate with a printed circuit board, the flexible printed circuit film comprising:
    a first area configured to be attached to the substrate;
    a second area configured to be connected with the printed circuit board; and
    a third area between the first area and the second area,
    wherein each of the first area and the third area has a trapezoid shape with a width that gradually decreases in a direction toward the second area, and the second area has a rectangular shape, and
    wherein the first area includes first and second sides facing each other and not parallel to each other, and a third side extending between the first and second sides.

2. The flexible printed circuit film according to claim 1, wherein a first angle between a line perpendicular to the third side of the first area and the first side of the first area satisfies a range of 5°≤α<45°, where α is the first angle.

3. The flexible printed circuit film according to claim 2, wherein the third area includes a first side connected with the first side of the first area, and
    wherein a second angle between a line perpendicular to the third side of the first area and the first side of the third area satisfies a range of 5°<β≤45°, where β is the second angle.

4. The flexible printed circuit film according to claim 3, wherein the second angle is greater than the first angle.

5. The flexible printed circuit film according to claim 1, wherein the first area and the second area respectively include third sides parallel to each other at opposite ends of the flexible printed circuit film, and a length of the third side of the first area is larger than a length of the third side of the second area.

6. A flexible printed circuit film configured to connect a substrate with a printed circuit board, the flexible printed circuit film comprising:
    a first area configured to be attached to the substrate;
    a second area configured to be connected with the printed circuit board;
    a third area between the first area and the second area;
    a fourth area between the first area and the third area to connect the first area with the third area; and
    a fifth area between the second area and the third area to connect the second area with the third area,
    wherein the third area has a trapezoid shape with a width that gradually decreases in a direction toward the second area, and
    each of the fourth area and the fifth area includes a first side of a curved shape.

7. The flexible printed circuit film according to claim 6, wherein the curved shape has a radius of curvature within a range of 5.0 mm to 20 mm.

8. The flexible printed circuit film according to claim 6, wherein the first area and the second area respectively include third sides parallel to each other at opposite ends of the flexible printed circuit film, and a length of the third side of the first area is larger than a length of the third side of the second area.

9. The flexible printed circuit film according to claim 6, wherein the first area has a trapezoid shape with a width that gradually decreases in a direction toward the second area, and the second area has a rectangular shape.

10. The flexible printed circuit film according to claim 6, wherein the first area is formed in a rectangular structure, and the second area is formed in a rectangular structure whose area is smaller than that of the first area.

11. A flexible printed circuit film configured to connect a substrate with a printed circuit board, the flexible printed circuit film comprising:
    a first area configured to be attached to the substrate and having a rectangular shape;
    a second area configured to be connected with the printed circuit board and having a rectangular shape with an area is smaller than that of the first area;
    a third area between the first area and the second area and having a trapezoid shape with a width that gradually decreases in a direction toward the second area; and
    a dummy area connected with one side of each of the first area, the second area, and the third area,
    wherein the first area includes first and second sides facing each other, and a third side extending between the first and second sides,
    wherein the third area includes a first side connected with the first side of the first area, and a second side connected with the second side of the first area, and
    wherein the dummy area includes a first side facing the first side of the first area, a second side facing the first side of the third area, and a third side extending from the third side of the first area.

12. The flexible printed circuit film according to claim 11, wherein a first angle between a line being perpendicular to the third side of the dummy area and the first side of the dummy area satisfies a range of 5°≤α<45°, with α being the first angle,
    wherein a second angle between a line perpendicular to the third side of the dummy area and the second side of the dummy area satisfies a range of 5°<β≤45°, with β being the second angle, and
    wherein the second angle is larger than the first angle.

13. The flexible printed circuit film according to claim 12,
wherein the dummy area further includes a fourth side of a curved shape extending between the first side of the dummy area and the second side of the dummy area to connect the first side of the dummy area with the second side of the dummy area, and
wherein the curved shape has a radius of curvature within a range of 5.0 mm to 20 mm.

14. The flexible printed circuit film according to claim 11,
wherein the first area includes first and second sides facing each other that are parallel to each other, and a third side extending between the first and second sides,
wherein the third area includes a first side connected with the first side of the first area, and a second side connected with the second side of the first area,
wherein the dummy area includes a first side that is parallel to the first side of the first area, a second side that is parallel to the first side of the third area, a third side extending from the third side of the first area, and a fourth side of a curved shape between the first side of the dummy area and the second side of the dummy area to connect the first side of the dummy area with the second side of the dummy area, and
wherein the curved shape of the fourth side has a radius of curvature in a range of 5.0 mm to 20 mm.

15. A display device, comprising:
first and second substrates confronting each other;
a pad on the first substrate;
a connection electrode connected with one side of the pad; and
a flexible printed circuit film connected with the connection electrode,
wherein the flexible printed circuit film includes:
a first area configured to be attached to the substrate;
a second area configured to be connected with the printed circuit board; and
a third area between the first area and the second area,
wherein each of the first area and the third area has a trapezoid shape with a width that gradually decreases in a direction toward the second area, and the second area has a rectangular shape, and
wherein the first area includes first and second sides facing each other and not parallel to each other, and a third side extending between the first and second sides.

16. A display device, comprising:
first and second substrates confronting each other;
a pad on the first substrate;
a connection electrode connected with one side of the pad; and
a flexible printed circuit film connected with the connection electrode,
wherein the flexible printed circuit film includes:
a first area configured to be attached to the substrate;
a second area configured to be connected with the printed circuit board;
a third area between the first area and the second area;
a fourth area between the first area and the third area to connect the first area with the third area; and
a fifth area between the second area and the third area to connect the second area with the third area,
wherein the third area has a trapezoid shape with a width that gradually decreases in a direction toward the second area, and
each of the fourth area and the fifth area includes a first side of a curved shape.

17. A display device, comprising:
first and second substrates confronting each other;
a pad on the first substrate;
a connection electrode connected with one side of the pad; and
a flexible printed circuit film connected with the connection electrode,
wherein the flexible printed circuit film includes:
a first area configured to be attached to the substrate and having a rectangular shape;
a second area configured to be connected with the printed circuit board and having a rectangular shape with an area is smaller than that of the first area;
a third area between the first area and the second area and having a trapezoid shape with a width that gradually decreases in a direction toward the second area; and
a dummy area connected with one side of each of the first area, the second area, and the third area,
wherein the first area includes first and second sides facing each other, and a third side extending between the first and second sides,
wherein the third area includes a first side connected with the first side of the first area, and a second side connected with the second side of the first area,
wherein the dummy area includes a first side facing the first side of the first area, a second side facing the first side of the third area, and a third side extending from the third side of the first area.

* * * * *